US008527088B2

(12) United States Patent
Tominaga

(10) Patent No.: US 8,527,088 B2
(45) Date of Patent: Sep. 3, 2013

(54) TRANSPORTATION SYSTEM

(75) Inventor: Tadamasa Tominaga, Aichi (JP)

(73) Assignee: Murata Machinery, Ltd., Kyoto-Shi (JP)

( * ) Notice: Subject to any disclaimer, the term of this patent is extended or adjusted under 35 U.S.C. 154(b) by 149 days.

(21) Appl. No.: 13/254,834

(22) PCT Filed: Feb. 15, 2010

(86) PCT No.: PCT/JP2010/000900
§ 371 (c)(1),
(2), (4) Date: Sep. 2, 2011

(87) PCT Pub. No.: WO2010/100834
PCT Pub. Date: Sep. 10, 2010

(65) Prior Publication Data
US 2012/0004767 A1    Jan. 5, 2012

(30) Foreign Application Priority Data
Mar. 3, 2009  (JP) ................................. 2009-049983

(51) Int. Cl.
G06F 7/00       (2006.01)
G05D 1/00       (2006.01)
E02F 3/36       (2006.01)

(52) U.S. Cl.
USPC ........... 700/230; 700/213; 700/214; 700/228; 700/229; 701/12; 414/562

(58) Field of Classification Search
None
See application file for complete search history.

(56) References Cited

U.S. PATENT DOCUMENTS

| 2005/0171656 | A1 | 8/2005 | Hori et al. | |
| 2006/0051188 | A1 | 3/2006 | Hoshino | |
| 2009/0279992 | A1* | 11/2009 | Spangler et al. | 414/562 |
| 2012/0136516 | A1* | 5/2012 | Harasaki | 701/19 |

FOREIGN PATENT DOCUMENTS

| JP | 63-189907 | 8/1988 |
| JP | 08-318486 | 12/1996 |
| JP | 2000-181542 | 6/2000 |
| JP | 2005-202464 | 7/2005 |
| JP | 2006-051886 | 2/2006 |

OTHER PUBLICATIONS

International Search Report for PCT/JP2010/000900 filed on Feb. 15, 2010 in the name of Tadamasa Tominaga (English and Non-English).
Written Opinion for for PCT/JP2010/000900 filed on Feb. 15, 2010 in the name of Tadamasa Tominaga (Non-English).
English Translation of the International Preliminary Report on Patentability (Chapter II) based off PCT/JP2010/000900 filed Feb. 15, 2010.
Office Action dated Apr. 8, 2013, issued for corresponding Korean Patent Application No. 10-2011-7019178.

* cited by examiner

Primary Examiner — Yolanda Jones
(74) Attorney, Agent, or Firm — Adli Law Group P.C.

(57) ABSTRACT

Upon receiving first data, a stop control unit (211) performs control such that a transportation vehicle (200) stops at a first stop position at which the transportation vehicle (200) can load the article onto a second apparatus. Upon receiving second data, the stop control unit (211) performs control such that the transportation vehicle (200) stops at a second stop position corresponding to a first apparatus.

4 Claims, 10 Drawing Sheets

| No. | Stop position | Distance (unit: millimeter) |
|---|---|---|
| 1 | ST11 | L11 |
| 2 | ST12 | L12 |
| 3 | ST13 | L13 |
| 4 | ST14 | L14 |

| No. | Stop position | Distance (unit: millimeter) |
|---|---|---|
| 1 | ST21 | L21 |
| 2 | ST22 | L22 |
| 3 | ST23 | L23 |

TRANSPORTATION SYSTEM

CROSS REFERENCE TO RELATED APPLICATIONS

The present application is the U.S. national stage entry under 35 U.S.C. 371 of PCT International Patent Application Serial No. PCT/JP2010/000900 filed on Feb. 15, 2010 which claims the benefit of priority to Japanese Patent Application Serial No. JP2009-049983 filed Mar. 3, 2009, both which are hereby incorporated by reference.

TECHNICAL FIELD

The present invention relates to a transportation system in which a transportation vehicle which transports an article is controlled.

BACKGROUND ART

There are conventional transportation systems in which articles are transported by a transportation vehicle such as an overhead transportation vehicle.

For example, a semiconductor plant for manufacturing semiconductor devices is divided into areas for different processes. Each of the areas is referred to as a bay and has a circuit track along which overhead transportation vehicles travel around unidirectionally.

Each of the transportation vehicles travels along the circuit track to transport articles such as wafers, which are material for semiconductor devices, to a manufacturing apparatus in the bay. The transportation vehicles therefore stop at a predetermined position. PTL 1 discloses a technique to stop an overhead traveling vehicle (transportation vehicle) at a stop position.

CITATION LIST

Patent Literature

[PTL 1]
Japanese Unexamined Patent Application Publication Number 2005-202464

SUMMARY OF INVENTION

Technical Problem

A manufacturing apparatus installed in a plant may be provided with an apparatus detachable from the manufacturing apparatus (hereinafter referred to as a detachable apparatus).

A transportation vehicle may transport an article to a position where the manufacturing apparatus, from which the detachable apparatus is detached, provides the transportation vehicle with a product manufactured by the manufacturing apparatus. When the transportation vehicle stops at different positions depending on whether or not the detachable apparatus is mounted on the manufacturing apparatus, an operator is required to adjust stop position data indicating the stop positions of the transportation vehicle.

The stop position data needs to be manually adjusted by an operator, and the adjustment takes a prolonged time as long as, for example, one hour (hereinafter, the time is referred to as adjustment period). Because of this, the transportation vehicle cannot travel in the area where the manufacturing apparatus is installed during the adjustment period, and therefore it is not until such a long adjustment period ends that the transportation vehicle restarts traveling. As a result, there, has been a problem that changing stop positions of the transportation vehicle takes a prolonged time.

The present invention, conceived to address the problem, has an object of providing a transportation system which allows quick change of stop positions of a transportation vehicle.

Solution to Problem

In order to address the problem, the transportation system according to an aspect of the present invention including: a track which is predetermined; a transportation vehicle capable of transporting an article to a first apparatus by traveling along the track; and a controller which controls the transportation vehicle, further includes: a second apparatus which is detachable from the first apparatus and onto which the transportation vehicle loads the article, wherein the controller includes a transmission unit configured to transmit, to the transportation vehicle, first data when the second apparatus is mounted on the first apparatus, and second data when the second apparatus is detached from the first apparatus, the first data being data for causing the transportation vehicle to stop at a first stop position at which the transportation vehicle can load the article onto the second apparatus, and the second data being data for causing the transportation vehicle to stop at a second stop position corresponding to the first apparatus, and the transportation vehicle includes: a communication unit configured to receive the first data or the second data; and a stop control unit configured to perform control so as to stop the transportation vehicle at the first stop position when the stop control unit receives the first data, and perform control so as to stop the transportation vehicle at the second stop position when the stop control unit receives the second data.

When receiving the first data, the stop control unit performs control such that the transportation vehicle stops at the first stop position. When receiving the second data, the stop control unit performs control such that the transportation vehicle stops at the second stop position. In other words, the stop positions of the transportation vehicle can be quickly changed depending on the type of the received data. As a result, the changing of stop positions of the transportation vehicle is done quickly.

It is to be noted that the present invention may be implemented as a method of controlling a transportation vehicle. The method includes the characteristic steps in the operation performed in the transportation system according to the present invention. It is also to be noted that the present invention may be implemented as a control program which causes a controller, which is a control apparatus, to execute the steps.

Advantageous Effects of Invention

According to the present invention, the stop positions of a transportation vehicle can be changed quickly.

BRIEF DESCRIPTION OF DRAWINGS

FIG. 9 illustrates first stop position data as an example.

FIG. 10 illustrates second stop position data as an example.

DESCRIPTION OF EMBODIMENTS

Figure 1:
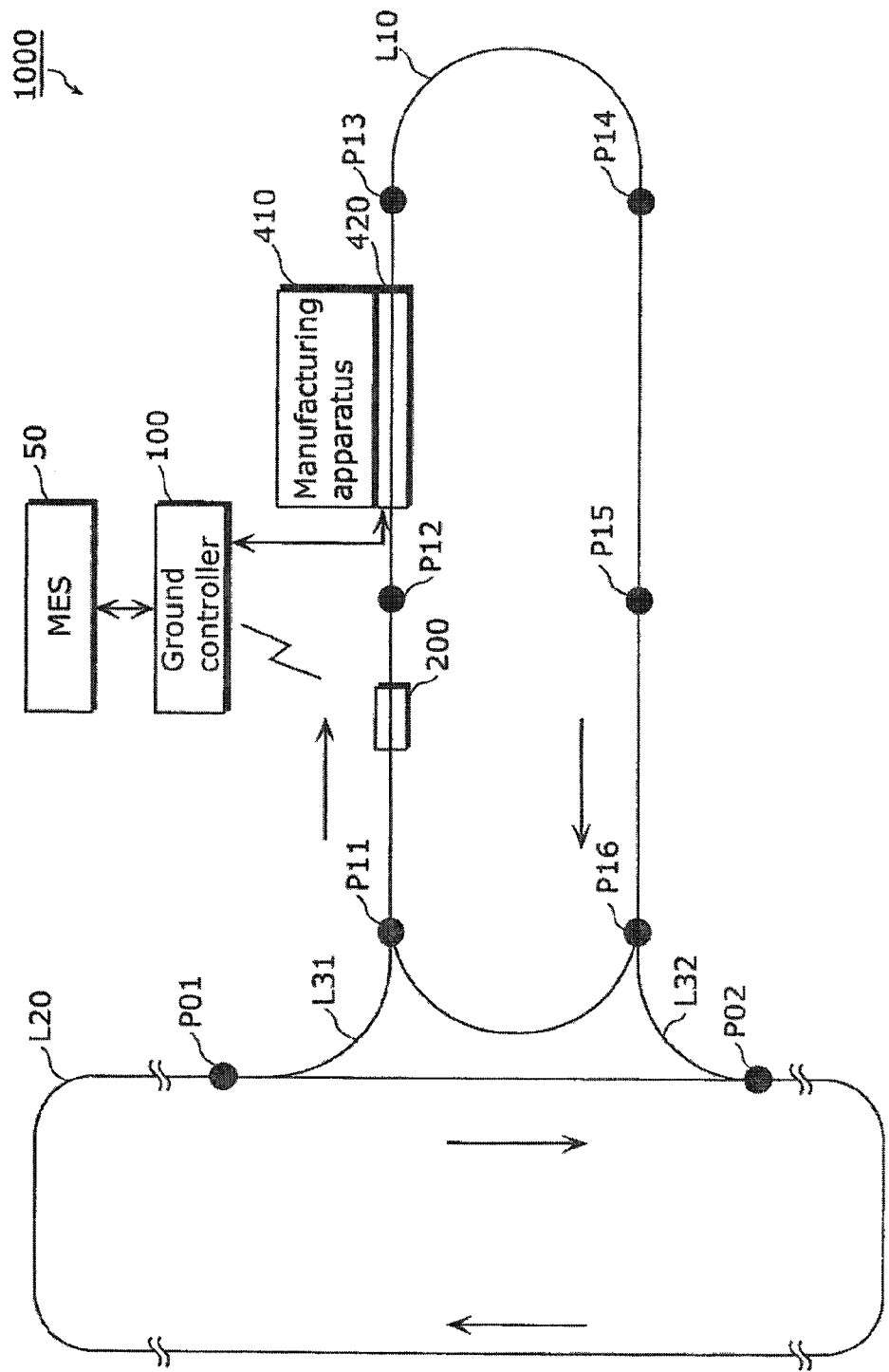
FIG. 1 shows a configuration of a transportation system according to Embodiment 1.

Embodiments of the present invention are described below with reference to the drawings. In the following, like reference numerals refer to like parts. The like parts have an identical name and identical functions. Thus a detailed description thereof is not repeated here.

Embodiment 1

FIG. 1 shows a configuration of a transportation system 1000 according to Embodiment 1. FIG. 1 also shows a manufacturing execution system (MES) 50 for clarity of the description, but the MES 50 is not included in the transportation system 1000.

The transportation system 1000 is installed in a facility of a plant for manufacturing semiconductor devices, for example.

As shown in FIG. 1, the transportation system 1000 includes a ground controller 100, a track L10, a connecting path L20, connecting paths L31 and L32, a transportation vehicle 200, a manufacturing apparatus 410, and a buffer apparatus 420.

The track L10 and the connecting paths L20, L31, and L32 are tracks along which the transportation vehicle 200 travels. The track L10 and the connecting paths L20, L31, and L32 are installed on the ceiling of the facility. The track L10 is a track passing through points P11 to P16.

The track L10 and the connecting path L20 allow the transportation vehicle 200 to travel only clockwise, for example. The connecting paths L31 and L32 are tracks connecting the track L10 and the connecting path L20.

The MES 50 is a computer for controlling the ground controller 100. The MES 50 manages statuses of the apparatuses in the transportation system 1000 through communications with the ground controller 100.

The ground controller 100 is a computer having a function of controlling the transportation vehicle 200.

The transportation vehicle 200 is an overhead transportation vehicle which travels along the tracks including the track L10.

The manufacturing apparatus 410 is, for example, an apparatus which manufactures a material for semiconductor devices, such as a wafer.

The buffer apparatus 420 is an apparatus including load ports each of which is capable of loading a cassette thereon. The cassette is a container which is capable of containing a predetermined number of wafers manufactured by the manufacturing apparatus 410.

The buffer apparatus 420 is an apparatus detachable from the manufacturing apparatus 410. Specifically, the buffer apparatus 420 is an apparatus which an operator may manually move. The buffer apparatus 420 includes a computer for various processes.

The ground controller 100 communicates with the buffer apparatus 420.

Figure 2:
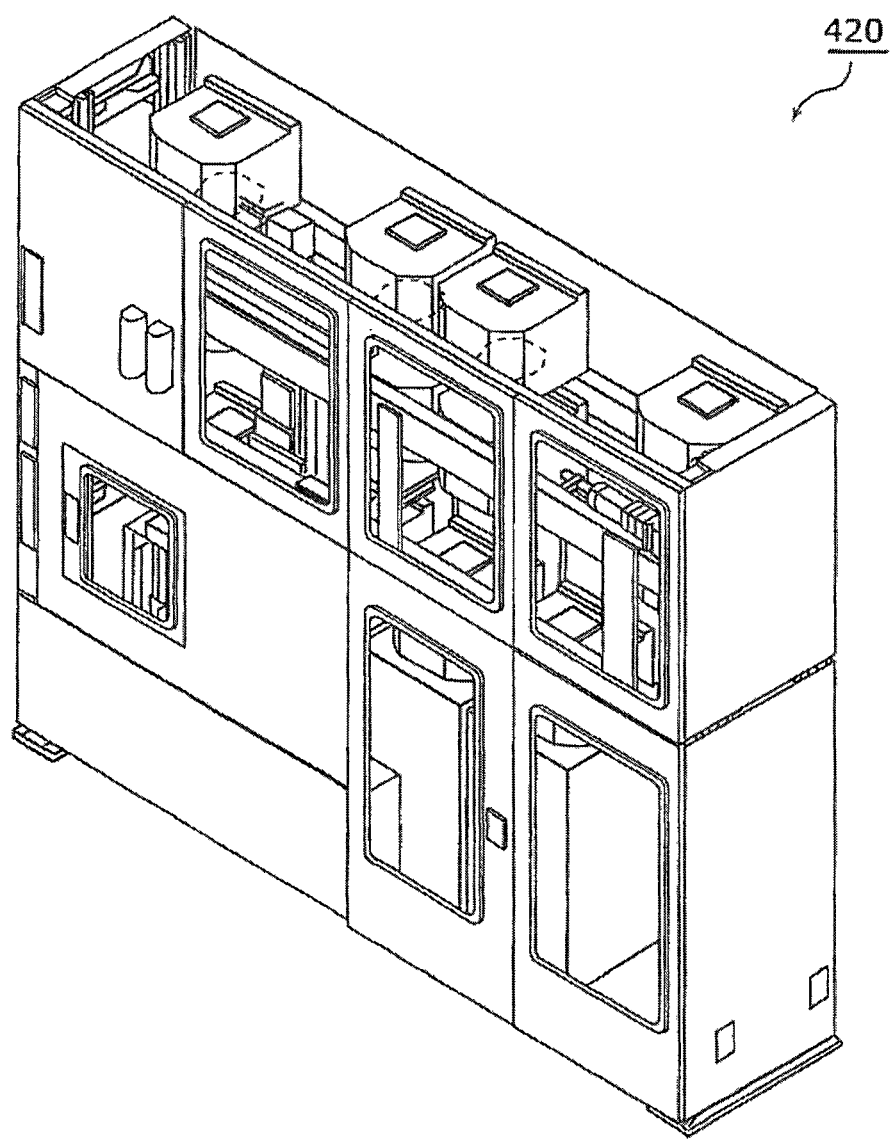
FIG. 2 is a perspective view illustrating an appearance of a buffer apparatus.

FIG. 2 is a perspective view illustrating an appearance of the buffer apparatus 420.

Figure 3:
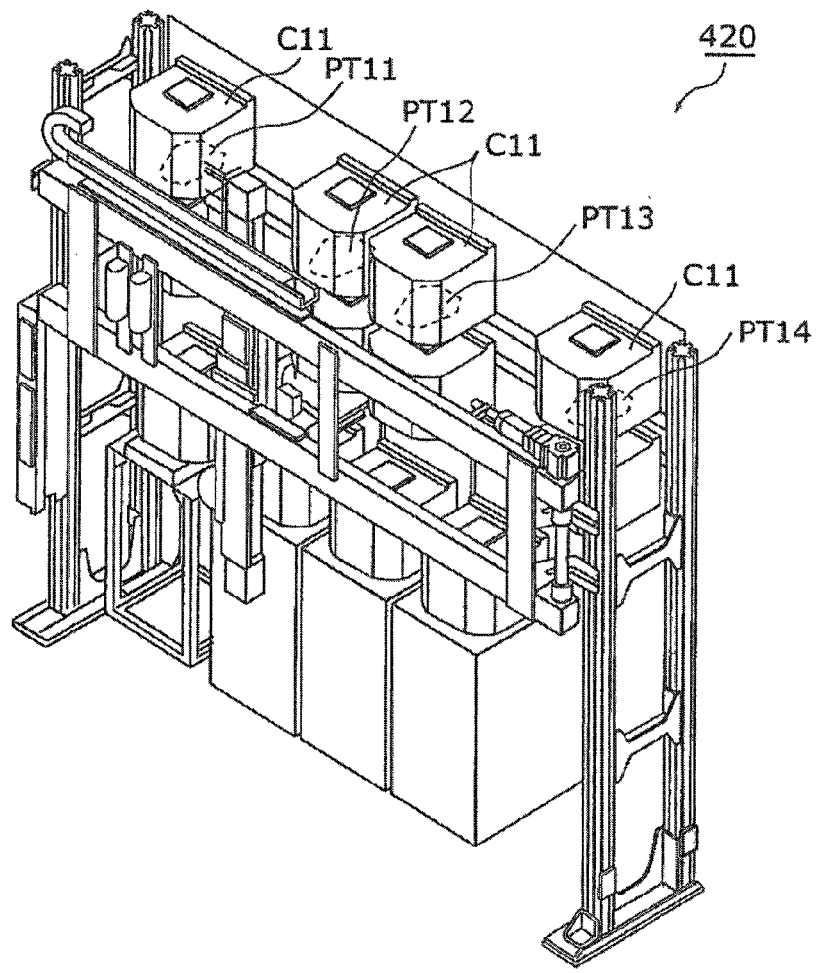
FIG. 3 is a perspective view illustrating the inside of the buffer apparatus.

FIG. 3 is a perspective view illustrating the inside of the buffer apparatus 420. As shown in FIG. 3, the buffer apparatus 420 includes load ports which are capable of loading cassettes C11 thereon. The load ports include, for example, load ports PT11, PT12, PT13, and PT14.

Figure 4:
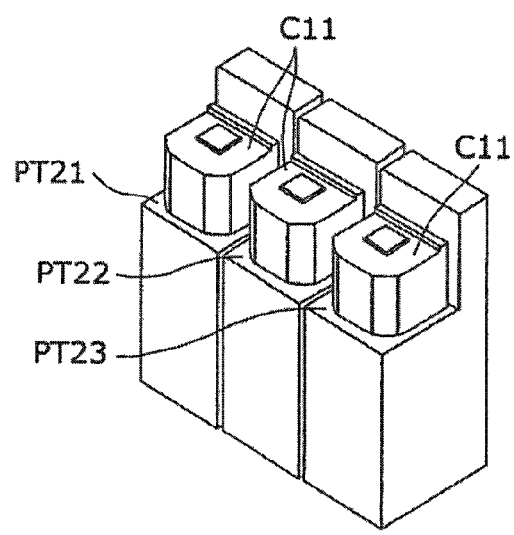
FIG. 4 shows load ports in the case where the buffer apparatus is detached from a manufacturing apparatus.

FIG. 4 shows such load ports. In FIG. 4, the buffer apparatus 420 is detached from the manufacturing apparatus 410.

The load ports shown in FIG. 4, load ports PT21, PT22, and PT23, are disposed at the positions such that the load ports PT21, PT22, and PT23 can receive wafers manufactured by the manufacturing apparatus 410 from the manufacturing apparatus 410. The positions of the load ports PT21, PT22, and PT23 are fixed. In other words, each of the positions of the load ports PT21, PT22, and PT23 corresponds to the manufacturing apparatus 410. In other words, each of the load ports PT21, PT22, and PT23 corresponds to the manufacturing apparatus 410.

Each of the load ports PT21, PT22, and PT23 is capable of having one of the cassettes C11 thereon.

The manufacturing apparatus 410 manufactures wafers and unloads the wafers so as to put the wafers into the cassette C11 on each of the load ports PT21, PT22, and PT23.

Here, it is assumed that the manufacturing apparatus 410 has unloaded the manufactured wafers into the cassette C11 on each of the load ports PT21, PT22, and PT23, and that the cassette C11 containing the wafer and placed on one of the load port PT21, PT22, and PT23 is loaded onto one of the load ports PT11, PT12, PT13, and PT14 of the buffer apparatus 420 by an operation of the transportation vehicle 200. In this case, the buffer apparatus 420 is an apparatus for temporary storage of the cassette C11 containing the wafer as an article unloaded from the manufacturing apparatus 410.

Here, it is also assumed that the cassette C11 containing the wafer and disposed on one of the load ports of the buffer apparatus 420 is loaded onto one of the load ports PT21, PT22, and PT23 by an operation of the transportation vehicle 200, and that the manufacturing apparatus 410 performs a process to obtain the wafer in the cassette C11 on each of the load ports PT21, PT22, and PT23. In this case, the buffer apparatus 420 is an apparatus for temporary storage of the cassette C11 containing the wafer as an article to be provided to the manufacturing apparatus 410.

FIG. 4 shows a status in which the cassette C11 is disposed on each of the load ports PT21, PT22, and PT23.

Figure 5:
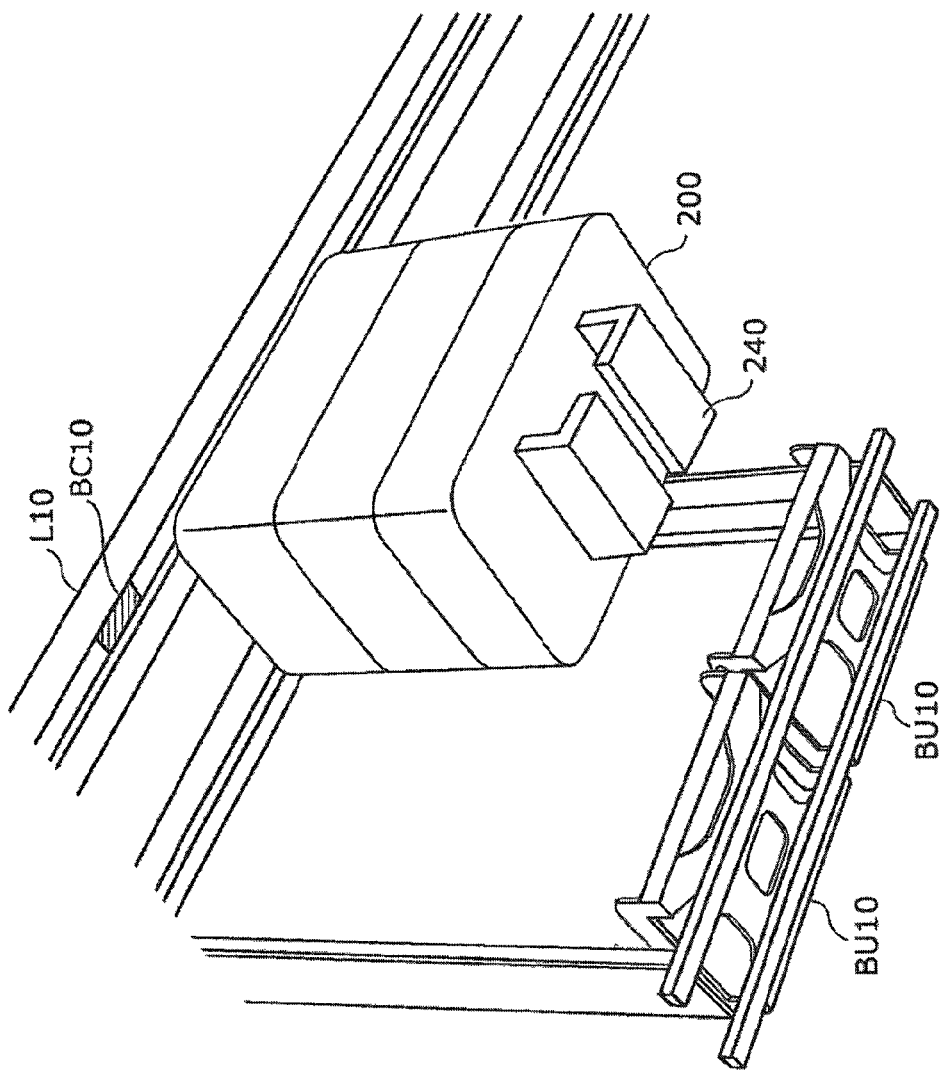
FIG. 5 is a perspective view illustrating an appearance of a transportation vehicle.

FIG. 5 is a perspective view illustrating an appearance of the transportation vehicle 200.

The transportation vehicle 200 is an overhead transportation vehicle which travels along, for example, a rail forming the track L10 as shown in FIG. 5. The transportation vehicle 200 includes an article holding unit 240 for holding an article.

When the buffer apparatus 420 is mounted on the manufacturing apparatus 410, the load ports PT11, PT12, PT13, and PT14 shown in FIG. 3 are disposed right under the track L10. The load ports PT21, PT22, and PT23 shown in FIG. 4 are disposed right under the track L10 as well.

The transportation vehicle 200 may travel along the track L10 to be above the load port PT11 and descend to a predetermined height under the instruction of the ground controller 100.

Furthermore, the transportation vehicle 200, holding the cassette C11 as an article on the load port PT11 in the article holding unit 240, may ascend and travel to be above the load port PT12 under the instruction of the ground controller 100. The transportation vehicle 200 above the load port PT12 may descend and load the article held in the article holding unit 240 (the cassette C11) onto the load port PT12, and then ascend.

The transportation vehicle 200 transports articles by repeating such a series of the operations.

The track L10 has a barcode BC10 attached thereto such that the transportation vehicle 200 can detect the positions of the load ports and so on.

The transportation vehicle 200 reads the barcode BC10 mounted on the track L10 with a barcode scanner of its own (not shown), and detects, with reference to a layout data stored in its own memory, where on the track L10 the transportation vehicle 200 itself is traveling or stops.

The track L10 further has overhead buffers BU10 on which an article transported by the transportation vehicle 200 may be temporarily placed.

Figure 6:
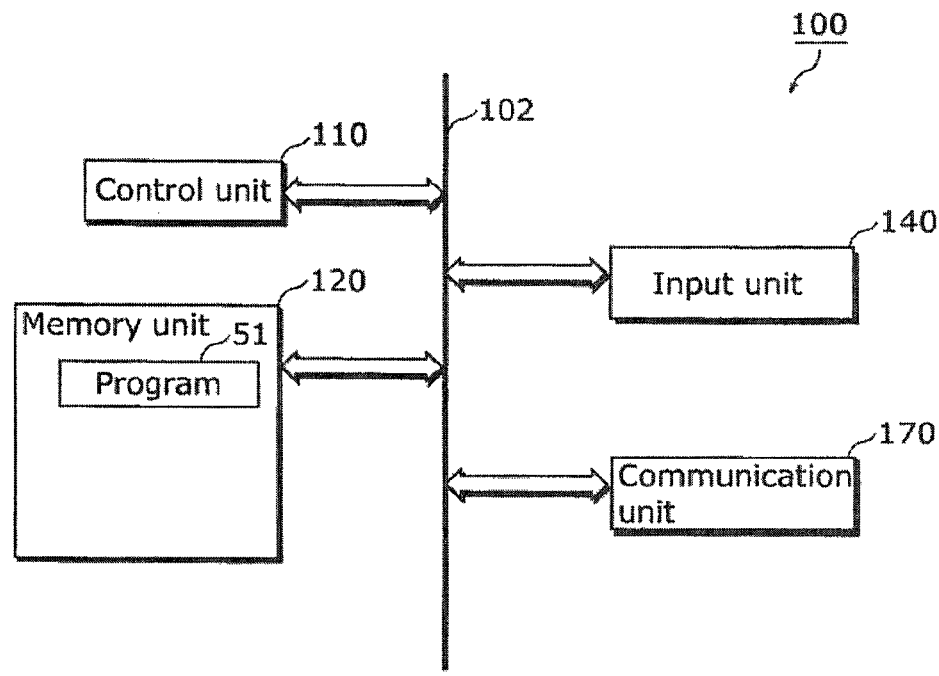
FIG. 6 is a block diagram illustrating a hardware configuration of the inside of a ground controller.

FIG. 6 is a block diagram illustrating a hardware configuration of the inside of the ground controller 100.

As shown in FIG. 6, the ground controller 100 includes a control unit 110, a memory unit 120, an input unit 140, and a communication unit 170. The control unit 110, the memory unit 120, the input unit 140, and the communication unit 170 are connected to a data bus 102.

The control unit 110 is a central processing unit (CPU). The control unit 110 is not limited to a CPU and may be a circuit having a calculation function.

The memory unit 120 is a non-volatile memory, such as a hard disk drive. It is to be noted that the memory unit 120 is not limited to a hard disk drive and may be a non-volatile memory of another type (for example, a flash memory). Various data including a program 51 is stored in the memory unit 120, and is accessed by the control unit 110.

The control unit 110 executes the program 51 stored in the memory unit 120, and, according to the program 51, performs processes for the units inside the ground controller 100 and calculations.

The input unit 140 is an input interface which receives operations from an operator. The input interface is, for example, a keyboard or a button. Upon receiving an operation from an operator, the input unit 140 transmits operational information according to the received operation to the control unit 110. The control unit 110 performs a predetermined process according to the received operational information.

The communication unit 170 wirelessly communicates data with the transportation vehicle 200. The communication unit 170 communicates data with the buffer apparatus 420.

Figure 7:
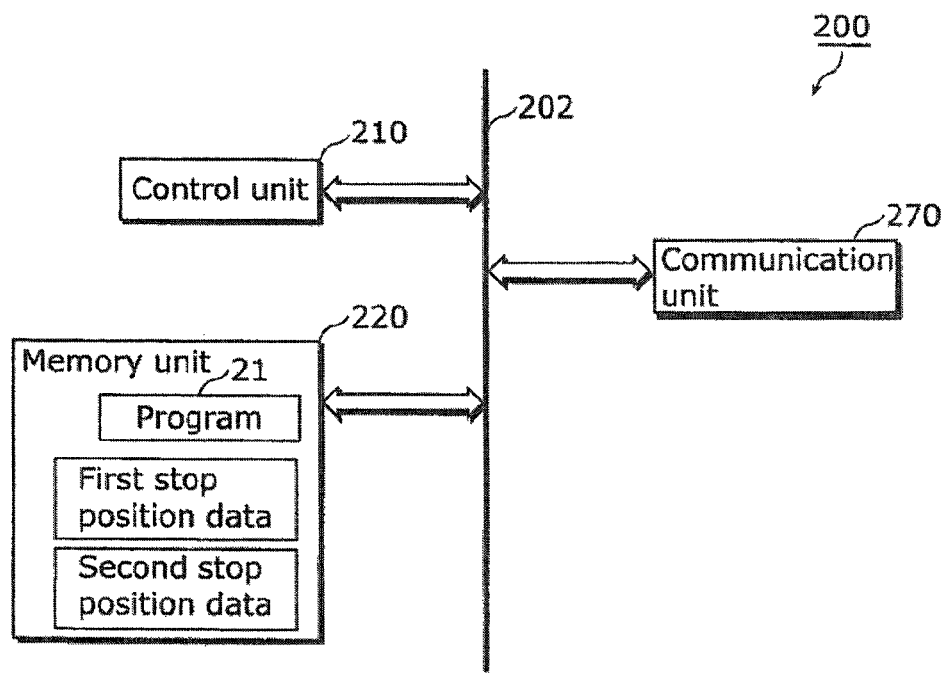
FIG. 7 is a block diagram illustrating a hardware configuration of the inside of the transportation vehicle.

FIG. 7 is a block diagram illustrating a hardware configuration of the inside of the transportation vehicle 200.

As shown in FIG. 7, the transportation vehicle 200 includes a control unit 210, a memory unit 220, and a communication unit 270. The control unit 210, the memory unit 220, and the communication unit 170 are connected to a data bus 202.

The control unit 210 is a central processing unit (CPU). The control unit 210 is not limited to a CPU and may be a circuit having a calculation function.

The memory unit 220 is a non-volatile memory, such as a hard disk drive. It is to be noted that the memory unit 220 is not limited to a hard disk drive and may be a non-volatile memory of another type (for example, a flash memory). Various data, including a program 21 and stop position data described later, is stored in the memory unit 220, and is accessed by the control unit 210.

The control unit 210 executes the program 21 stored in the memory unit 220, and, according to the program 21, performs processes for the units inside the transportation vehicle, calculations, and control of operations of the transportation vehicle 200. The control of operations of the transportation vehicle 200 is control for causing the transportation vehicle 200 to stop or move, for example.

The communication unit 270 wirelessly communicates data with the ground controller 100.

The following describes stop positions of the transportation vehicle 200.

Figure 8:
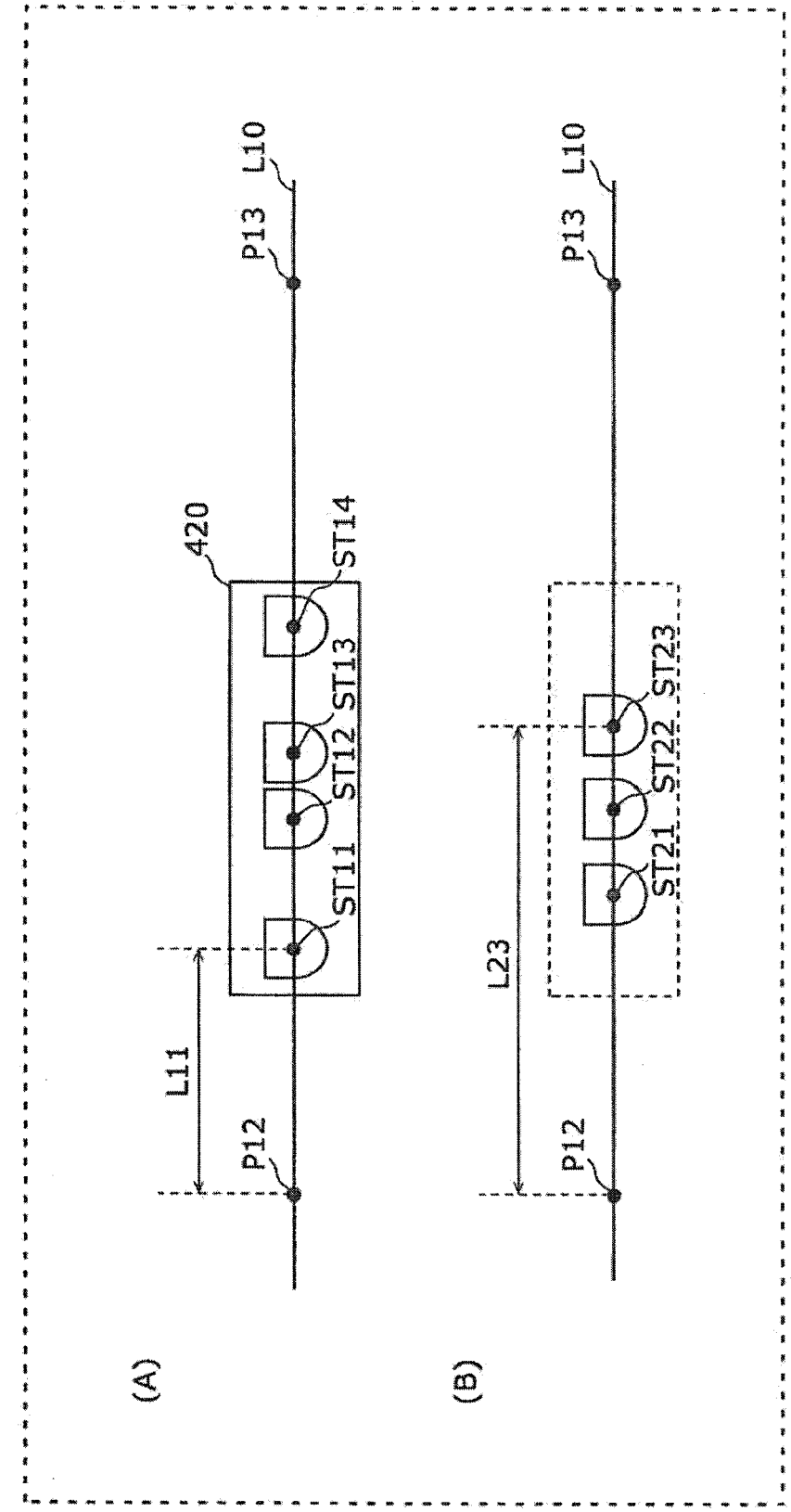
FIG. 8 illustrates the stop positions of the transportation vehicle.

FIG. 8 illustrates the stop positions of the transportation vehicle 200.

(A) of FIG. 8 shows stop positions ST11, ST12, ST13, and ST14 where the transportation vehicle 200 stops when the buffer apparatus 420 is mounted on the manufacturing apparatus 410.

The stop positions ST11, ST12, ST13, and ST14 correspond to the load ports PT11, PT12, PT13, and PT14 shown in FIG. 3, respectively.

For example, the transportation vehicle 200 stops at the stop position ST12 when the transportation vehicle 200 loads the cassette C11 onto the load port PT12 of the buffer apparatus 420 or when the transportation vehicle 200 picks up the cassette C11 on the load port PT12 of the buffer apparatus 420.

(B) of FIG. 8 shows stop positions ST21, ST22, and ST23 where the transportation vehicle 200 stops when the buffer apparatus 420 is detached from the manufacturing apparatus 410.

The stop positions ST21, ST22, and ST23 correspond to load ports PT21, PT22, and PT23 shown in FIG. 4, respectively. As described above, each of the load ports PT21, PT22, and PT23 corresponds to the manufacturing apparatus 410. Each of the stop positions ST21, ST22, and ST23 therefore corresponds to the manufacturing apparatus 410.

For example, the transportation vehicle 200 stops at the stop position ST23 when the transportation vehicle 200 loads the cassette C11 onto the load port PT23 corresponding to the manufacturing apparatus 410 or when the transportation vehicle 200 picks up the cassette C11 on the load port PT23 corresponding to the manufacturing apparatus 410.

Hereinafter, transportation of the cassette C11 by the transportation vehicle 200 to one of the load ports PT21, PT22, and PT23 each corresponding to the manufacturing apparatus 410 is referred to as transportation of the cassette C11 by the transportation vehicle 200 to the manufacturing apparatus 410. In addition, the manufacturing apparatus 410 is hereinafter referred to as the destination of the transportation of the cassette C11 by the transportation vehicle 200 when the destination of transportation of the cassette C11 by the transportation vehicle 200 is one of the load ports PT21, PT22, and PT23 each corresponding to the manufacturing apparatus 410.

In addition, the apparatus to be the destination of transportation of the cassette C11 by the transportation vehicle 200 is hereinafter referred to as a transportation destination apparatus. When the transportation destination apparatus is the manufacturing apparatus 410, the transportation vehicle 200 transports the cassette C11 to one of the load ports PT21, PT22, and PT23.

When the buffer apparatus 420 is mounted on the manufacturing apparatus 410, the stop position data specifying the stop position ST11, ST12, ST13, and ST14 is first stop position data D100 described below.

FIG. 9 illustrates the first stop position data D100 as an example. The first stop position data D100 includes four stop data items.

In FIG. 9, the column of "No." includes numbers each specifying one of the stop data items. The column of "Stop position" includes the stop positions described with reference to (A) of FIG. 8. In FIG. 9, the column of "Distance" includes distances from the point P12 on the track L10 shown in FIG. 1, (A) of FIG. 8, or (B) of FIG. 8 to the respective stop positions. For example, the stop data item numbered 1 indicates that the distance from the point P12 on the track L10 to the stop position ST11 is L11 (for example, 1200 mm). In other words, the first stop position data D100 shows stop positions between the consecutive points on the track L10 shown in (A) of FIG. 8, that is, between the point P12 and the point P13.

When the buffer apparatus 420 is detached from the manufacturing apparatus 410, the stop position data specifying the stop positions ST21, ST22, and ST23 is second stop position data D200 described below.

FIG. 10 illustrates the second stop position data D200 as an example. The second stop position data D200 includes three stop data items.

The columns of the second stop position data D200 are the same as the columns of the first stop position data D100 in FIG. 9, and therefore the detailed description thereof is not repeated here. In other words, the second stop position data D200 shows stop positions between the consecutive points on the track L10 shown in (B) of FIG. 8, that is, between the point P12 and the point P13.

For example, the stop data item numbered 3 in the second stop position data D200 indicates that the distance from the point P12 on the track L10 to the stop position ST23 in (B) of FIG. 8 is L23 (for example, 1800 mm).

The first stop position data D100 as shown in FIG. 9 and the second stop position data D200 as shown in FIG. 10 are stored in the memory unit 220 of the transportation vehicle 200 in advance.

The following describes a process of changing stop positions of the transportation vehicle 200.

The apparatuses perform processes as described below when the buffer apparatus 420 mounted on the manufacturing apparatus 410 is removed from the manufacturing apparatus 410.

When the buffer apparatus 420 is mounted on the manufacturing apparatus 410, the apparatus to be the destination of the transportation of the cassette C11 by the transportation vehicle 200 is the buffer apparatus 420.

Here, it is assumed that the manufacturing apparatus 410 is in operation.

Figure 11:
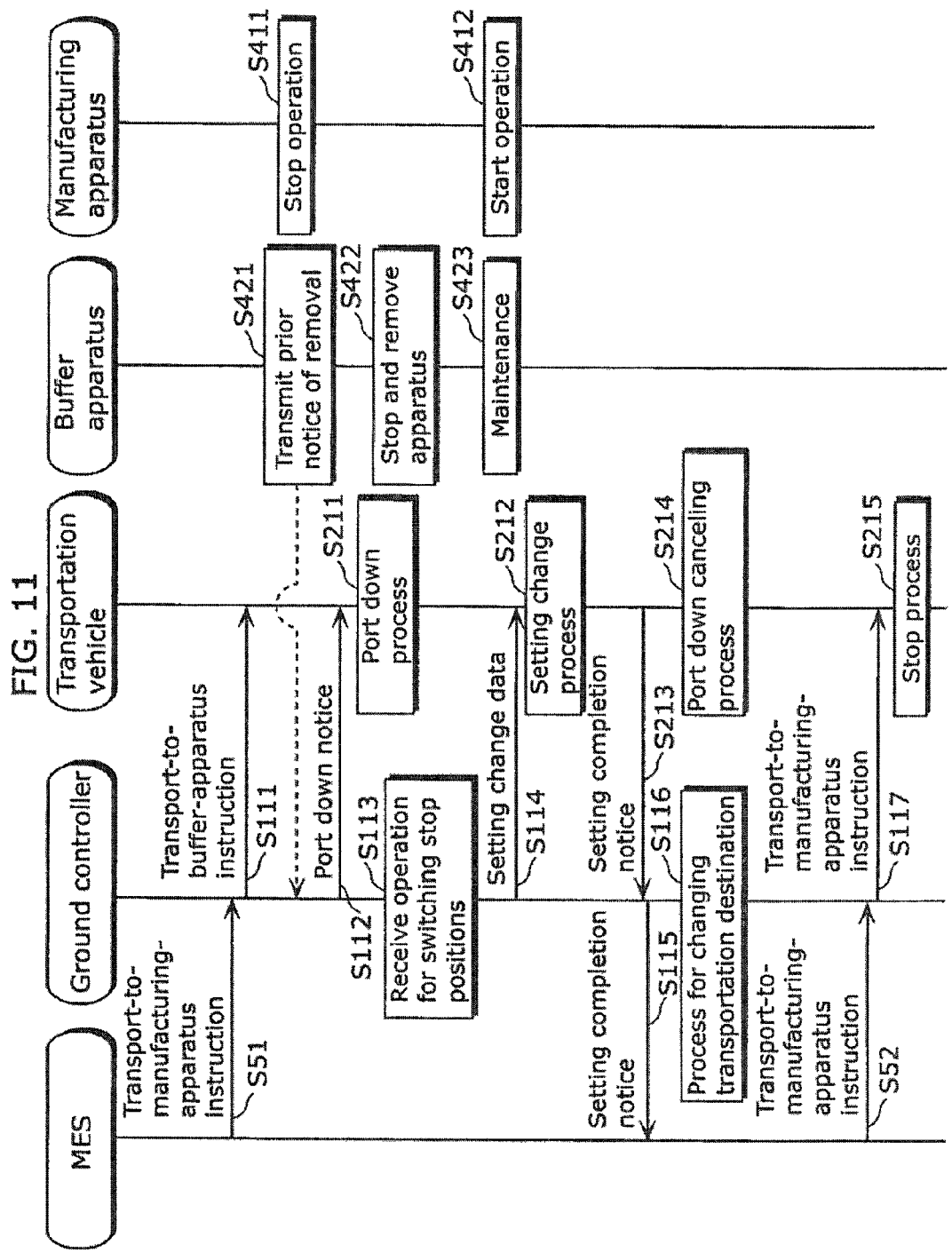
FIG. 11 illustrates processes which a MES, the ground controller, the transportation vehicle, the buffer apparatus, and the manufacturing apparatus perform in the case where the buffer apparatus is removed from the manufacturing apparatus.

FIG. 11 illustrates processes which the MES 50, the ground controller 100, the transportation vehicle 200, the buffer apparatus 420, and the manufacturing apparatus 410 perform. In the processes, the buffer apparatus 420 is removed from on the manufacturing apparatus 410.

First, the MES 50 transmits, to the ground controller 100, a transport-to-manufacturing-apparatus instruction (S51). The transport-to-manufacturing-apparatus instruction is a transportation instruction for causing the transportation vehicle 200 to transport the cassette C11 to the manufacturing apparatus 410. That is, the transport-to-manufacturing-apparatus instruction is a transportation instruction for causing the transportation vehicle 200 to transport the cassette C11 to one of the load ports PT21, PT22, and PT23 each corresponding to the manufacturing apparatus 410.

When the control unit 110 of the ground controller 100 does not receive a prior notice of removal, which is described later, within a predetermined time from the receipt of the transport-to-manufacturing-apparatus instruction, the control unit 110 transmits, to the transportation vehicle 200, a transport-to-buffer-apparatus instruction (S111).

Here, the prior notice of removal is information for notifying that the buffer apparatus 420 is removed from the manufacturing apparatus 410 after a lapse of at least a predetermined time (for example, three minutes). Here, when the control unit 110 does not receive a prior notice of removal with in a predetermined time from the receipt of the transport-to-manufacturing-apparatus instruction, the buffer apparatus 420 remains mounted on the manufacturing apparatus 410. The transport-to-buffer-apparatus instruction is a transportation instruction for causing the transportation vehicle 200 to transport the cassette C11 to the buffer apparatus 420.

As described above, when the buffer apparatus 420 is mounted on the manufacturing apparatus 410, the destination apparatus of the transportation of the cassette C11 by the transportation vehicle 200 is the buffer apparatus 420. The control unit 110 therefore transmits, to the transportation vehicle 200, a transport-to-buffer-apparatus instruction when the control unit 110 has not received a prior notice of removal.

The transport-to-buffer-apparatus instruction includes load port information. The load port information indicates, for example, a load port to be the destination onto which the cassette C11 is loaded. The load port information also indicates operational information. The operational information indicates, for example, an operation for moving the cassette C11 onto the load port indicated as a destination by the load port information.

Upon receiving the transport-to-buffer-apparatus instruction, the control unit 210 of the transportation vehicle 200 performs control such that the transportation vehicle 200 stops at, among the four stop positions indicated by the first stop position data D100, the stop position corresponding to the load port indicated by the load port information in the transport-to-buffer-apparatus instruction (for example, the load port PT11) so that the cassette C11 is transported to the buffer apparatus 420.

This causes the transportation vehicle 200 to travel to the stop position corresponding to the load port indicated by the load port information and stop there to perform the operation indicated by the operational information indicated by the load port information.

Next, an operator performs an operation for stopping the operation of the manufacturing apparatus 410. The operator's operation is, for example, to press a button provided outside the manufacturing apparatus 410. This operation stops the operation of the manufacturing apparatus 410 (S411).

The operator also makes a prior notice of removal. The operator makes the prior notice of removal by, for example, pressing a removal notice button (not shown) provided outside the buffer apparatus 420. Upon being pressed, the removal notice button transmits the prior notice of removal to the ground controller 100.

When the operator makes a prior notice of removal, a computer of the buffer apparatus 420 (not shown) transmits the prior notice of removal to the ground controller 100 (S421).

Upon receiving the prior notice of removal, the control unit 110 of the ground controller 100 transmits a port down notice to the transportation vehicle 200 (S112). The port down notice indicates to the transportation vehicle 200 that, for example, moving a cassette to the load port of the buffer apparatus 420 or to the load port corresponding to the manufacturing apparatus 410 is not allowed now. That is, the port down notice is information for notifying which load port is unusable (hereinafter referred to as an unusable load port).

The unusable load port is, for example, a load port of the buffer apparatus 420 and a load port corresponding to the manufacturing apparatus 410. The port down notice also indicates unusable load port.

Upon receiving the port down notice, the control unit 210 of the transportation vehicle 200 performs a port down process (S211). In the port down process, the control unit 210 sets port down. Specifically, the control unit 210 stores, in the memory unit 220, information indicating that use of the load port indicated by the port down notice is now allowed (hereinafter referred to as port down information).

The port down information indicates information indicating an unusable load port. Port down is set when the memory unit 220 stores port down information.

Upon receiving the port down notice, the control unit 210 of the transportation vehicle 200 controls the transportation vehicle 200 such that the transportation vehicle 200 avoid performing a process for loading a cassette onto the unusable load port indicated by the port down notice or a process for picking up a cassette on the unusable load port until the port down is canceled.

After making a prior notice of removal, the operator performs an operation for stopping the operation of the buffer apparatus 420 and removes the buffer apparatus 420 from the manufacturing apparatus 410 (S422).

In addition, the operator performs an operation for switching stop positions, using the input unit 140 of the ground controller 100. In other words, the input unit 140 receives an operation for switching stop positions (S113). The operation for switching stop positions is an operation for causing the transportation vehicle 200 to use the second stop position data D200.

Next, the operator does, for example, maintenance on the removed buffer apparatus 420 (S423).

The operator also performs an operation for starting the manufacturing apparatus 410 not in operation. The operator's operation is, for example, to press a button provided outside the manufacturing apparatus 410. This operation causes the manufacturing apparatus 410 to start operation (S412).

When the input unit 140 receives the operator's operation for switching stop positions, the control unit 110 of the ground controller 100 transmits setting change data to the transportation vehicle 200 (S114). The setting change data is data indicating an instruction such that stop position data to be used by the transportation vehicle 200 is set to the second stop position data D200.

Upon receiving the setting change data via the communication unit 270, the control unit 210 of the transportation vehicle 200 performs a setting change process (S212). In the setting change process, the control unit 210 sets the stop position data to be used to the second stop position data D200.

Next, the control unit 210 transmits a setting completion notice to the ground controller 100 (S213). The setting completion notice is a notice indicating that the process for setting the stop position data to be used by the transportation vehicle 200 to the second stop position data D200 is completed.

The control unit 210 performs a port down canceling process (S214). The port down canceling process is a process for canceling port down. Specifically, the control unit 210 erases the port down information stored in the memory unit 220, so that use of the unusable load port is allowed. That is, the port down is canceled.

Upon receiving the setting completion notice, the control unit 110 of the ground controller 100 transmits the received setting completion notice to the MES 50 (S115).

The MES 50 is notified by the setting completion notice that the stop position data to be used by the transportation vehicle 200 is set to the second stop position data D200.

After transmitting the setting completion notice, the control unit 110 of the ground controller 100 performs a process for changing transportation destination (S116).

In the process for changing transportation destination, the control unit 110 changes, from the buffer apparatus 420 to the manufacturing apparatus 410, the apparatus to be the destination of transportation according to the received transport-to-manufacturing-apparatus instruction upon receiving the transport-to-manufacturing-apparatus instruction from the MES 50.

In other words, the process for changing transportation destination is a process for changing the apparatus to be the destination of the transportation of the cassette C11 by the transportation vehicle 200 (transportation destination apparatus) from the buffer apparatus 420 to the manufacturing apparatus 410. In this case, upon receiving, from the MES 50, the transport-to-manufacturing-apparatus instruction, the control unit 110 transmits, to the transportation vehicle 200, the received transport-to-manufacturing-apparatus instruction.

Here, it is assumed that the MES 50 transmits, to the ground controller 100, a transport-to-manufacturing-apparatus instruction (S52).

Then, the control unit 110 of the ground controller 100 receives the transport-to-manufacturing-apparatus instruction. In this case, the apparatus to be the destination of transportation of the cassette C11 by the transportation vehicle 200 (that is, the transportation destination apparatus) is the manufacturing apparatus 410, and therefore the control unit 110 transmits, to the transportation vehicle 200, the received transport-to-manufacturing-apparatus instruction (S117).

The transport-to-manufacturing-apparatus instruction includes load port information. The load port information indicates, for example, the load port to be the destination onto which the cassette C11 is loaded. The load port information also indicates operational information. The operational information indicates, for example, an operation for moving the cassette C11 onto the load port indicated as the destination by the load port information.

Upon receiving the transport-to-manufacturing-apparatus instruction, the control unit 210 of the transportation vehicle 200 performs a stop process (S215). In the stop process, the control unit 210 performs control such that the transportation vehicle 200 stops at, among the three stop positions indicated by the second stop position data D200, the stop position corresponding to the load port indicated by the load port information in the transport-to-manufacturing-apparatus instruction (for example, the stop position ST21 corresponding to the load port PT21) so that the cassette C11 is transported to the manufacturing apparatus 410.

This causes the transportation vehicle 200 to travel to the stop position corresponding to the load port indicated by the load port information and stop there to perform the operation indicated by the operational information indicated by the load port information.

It is to be noted that route down may be set instead of the port down set as in Embodiment 1. Route down is a process for making traveling along part of the track along which the transportation vehicle 200 (for example, the track L10) not allowed. Hereinafter, the track traveling along which is not allowed is referred to as a route down track. When route down is set, the control unit 210 of the transportation vehicle 200 controls the transportation vehicle 200 such that the transportation vehicle 200 avoids traveling along the route down track.

In the case where transportation vehicle 200 cannot transport the cassette C11 to the buffer apparatus 420 because of port down or route down during the transportation to the buffer apparatus 420, the control unit 210 places the transportation vehicle 200 to a temporary error status.

In this case, the ground controller 100 transmits a temporary-storage instruction to the transportation vehicle 200. The temporary-storage instruction is an instruction for causing the transportation vehicle 200 to load the cassette C11 onto the overhead buffer BU10 described above with reference to FIG. 5.

Upon receiving the temporary-storage instruction, the transportation vehicle 200 loads the cassette C11 onto the overhead buffer BU10 for temporary storage. When, for example, the port down or route down is canceled so that the track to the manufacturing apparatus 410 to transport the cassette C11 is available, the ground controller 100 transmits, to the transportation vehicle 200, an instruction for transporting the cassette C11 on the overhead buffer BU10 to the manufacturing apparatus 410.

Upon receiving the instruction, the transportation vehicle 200 transports the cassette C11 on the overhead buffer BU10 to the manufacturing apparatus 410.

The following describes the processes performed by the apparatuses when the buffer apparatus 420 detached from the manufacturing apparatus 410 is mounted on the manufacturing apparatus 410. When the buffer apparatus 420 is detached from the manufacturing apparatus 410, the apparatus to be the destination of the transportation of the cassette C11 by the transportation vehicle 200 is the manufacturing apparatus 410. Specifically, the destination of transportation of the cassette C11 is one of the load ports PT21, PT22, and PT23 each corresponding to the manufacturing apparatus 410.

Here, it is assumed that the manufacturing apparatus 410 is in operation. It is also assumed that, as the result of the setting change process described above, the stop position data to be used by the transportation vehicle 200 is set to the second stop position data D200. It is also assumed that, as the result of the process for changing transportation destination described above, the apparatus to be the destination of transportation is set in the ground controller 100 to the manufacturing apparatus 410.

It is also assumed that the operator is doing maintenance of the buffer apparatus 420 detached from the manufacturing apparatus 410.

Figure 12:
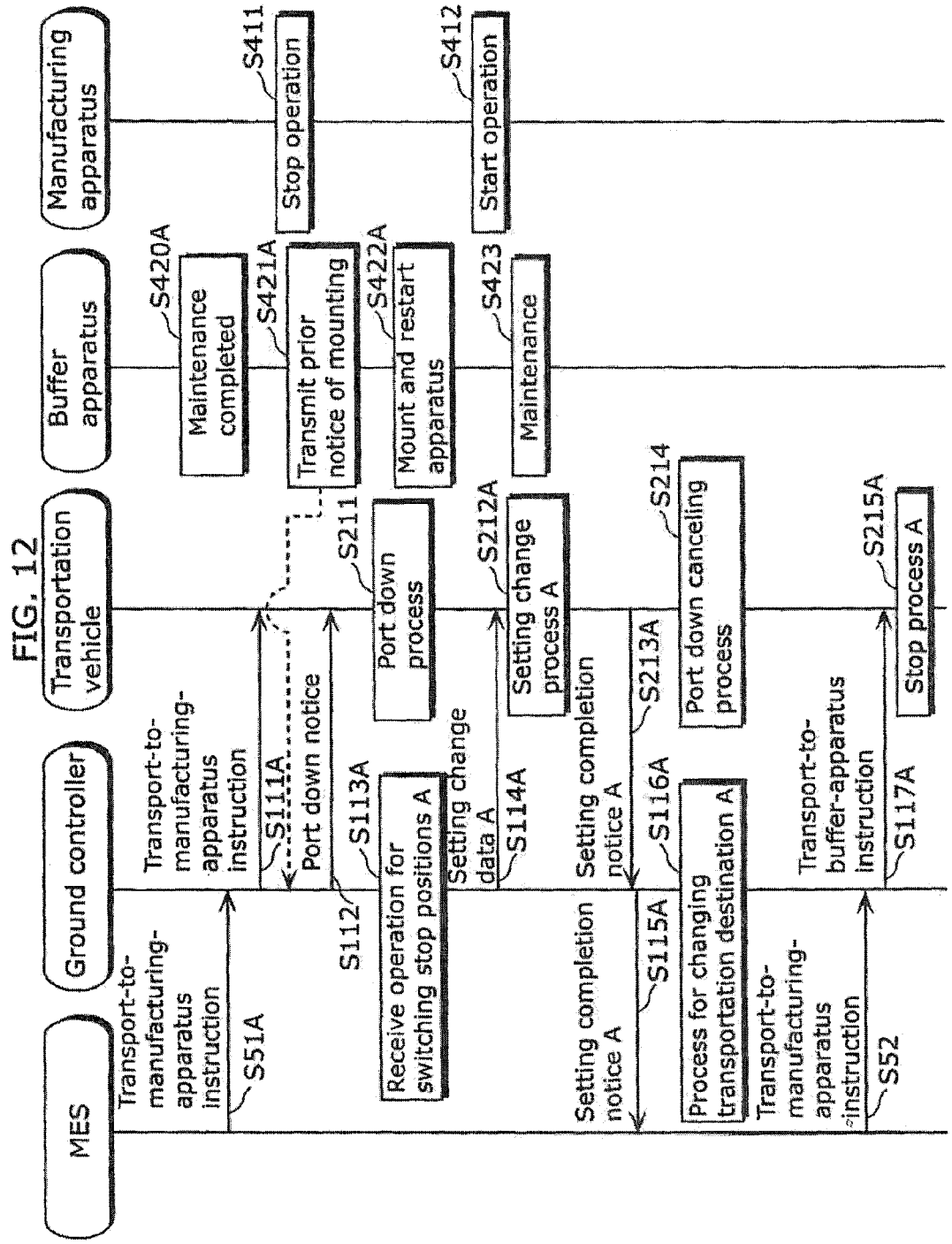
FIG. 12 illustrates processes which the MES, the ground controller, the transportation vehicle, the buffer apparatus, and the manufacturing apparatus perform in the case where the buffer apparatus is attached to the manufacturing apparatus.

FIG. 12 illustrates processes which the MES 50, the ground controller 100, the transportation vehicle 200, the buffer apparatus 420, and the manufacturing apparatus 410 perform. In the processes, the buffer apparatus 420 detached is attached to the manufacturing apparatus 410.

First, the MES 50 transmits, to the ground controller 100, a transport-to-manufacturing-apparatus instruction (S51A). The transport-to-manufacturing-apparatus instruction is a transportation instruction for causing the transportation vehicle 200 to transport the cassette C11 to the manufacturing apparatus 410. That is, the transport-to-manufacturing-apparatus instruction is a transportation instruction for causing the transportation vehicle 200 to transport the cassette C11 to one of the load ports PT21, PT22, and PT23 each corresponding to the manufacturing apparatus 410.

Then, the control unit 110 of the ground controller 100 receives the transport-to-manufacturing-apparatus instruction. In this case, the apparatus to be the destination of transportation of the cassette C11 by the transportation vehicle 200 is the manufacturing apparatus 410, and therefore the control unit 110 transmits, to the transportation vehicle 200, the received transport-to-manufacturing-apparatus instruction (S111A).

The transport-to-manufacturing-apparatus instruction includes load port information. The load port information indicates, for example, the load port to be the destination onto which the cassette C11 is loaded. The load port information also indicates operational information. The operational information indicates, for example, an operation for moving the cassette C11 onto the load port indicated as the destination by the load port information.

Upon receiving the transport-to-manufacturing-apparatus instruction, the control unit 210 of the transportation vehicle 200 performs control such that the transportation vehicle 200 stops at, among the three stop positions indicated by the second stop position data D200, the stop position corresponding to the load port indicated by the load port information in the transport-to-manufacturing-apparatus instruction (for example, the stop position ST21 corresponding to the load port PT21) so that the cassette C11 is transported to the manufacturing apparatus 410.

This causes the transportation vehicle 200 to travel to the stop position corresponding to the load port indicated by the load port information and stop there to perform the operation indicated by the operational information indicated by the load port information.

Next, an operator performs an operation for stopping the operation of the manufacturing apparatus 410. This operation stops the operation of the manufacturing apparatus 410 (S411).

Next, it is assumed that the operator has completed the maintenance of the buffer apparatus 420 (S420A).

The operator also makes a prior notice of mounting. The operator makes a prior notice of mounting by, for example, pressing a mounting notice button (not shown) provided outside the buffer apparatus 420. Upon being pressed, the removal notice button transmits the prior notice of mounting to the ground controller 100. Here, the prior notice of mounting is information for notifying that the buffer apparatus 420 is mounted on the manufacturing apparatus 410 after a lapse of at least a predetermined time (for example, three minutes).

When the operator makes a prior notice of mounting, the computer of the buffer apparatus 420 (not shown) transmits the prior notice of mounting to the ground controller 100 (S421A).

Upon receiving the prior notice of mounting, the control unit 110 of the ground controller 100 transmits a port down notice as described above to the transportation vehicle 200 (S112).

Upon receiving the port down notice, the control unit 210 of the transportation vehicle 200 performs a port down process (S211). The port down process has been described above and therefore not repeated here.

The operator then mounts the buffer apparatus 420 on the manufacturing apparatus 410 and performs an operation for restarting the operation of the buffer apparatus 420 (S422A).

In addition, the operator performs an operation for switching stop positions A, using the input unit 140 of the ground controller 100. In other words, the input unit 140 receives an operation for switching stop positions A (S113A). The operation for switching stop positions A is an operation for causing the transportation vehicle 200 to use the first stop position data D100.

The operator also performs an operation for restarting the manufacturing apparatus 410 not in operation. The operator's operation is, for example, to press a button provided outside the manufacturing apparatus 410. This operation causes the manufacturing apparatus 410 to start operation (S412).

When the input unit 140 receives the operator's operation for switching stop positions A, the control unit 110 of the ground controller 100 transmits setting change data A to the transportation vehicle 200 (S114A). The setting change data A is data indicating an instruction such that stop position data to be used by the transportation vehicle 200 is set to the first stop position data D100.

Upon receiving the setting change data A via the communication unit 270, the control unit 210 of the transportation vehicle 200 performs a setting change process A (S212A). In the setting change process A, the control unit 210 sets the stop position data to be used to the first stop position data D100. Next, the control unit 210 transmits, to the ground controller 100, a setting completion notice A (S213A). The setting completion notice A is a notice indicating that the process for setting the stop position data to be used by the transportation vehicle 200 to the first stop position data D100 is completed.

The control unit 210 performs a port down canceling process (S214). The port down canceling process has been described above and therefore not repeated here.

Upon receiving the setting completion notice A, the control unit 110 of the ground controller 100 transmits the received setting completion notice A to the MES 50 (S115A).

The MES 50 is notified by the setting completion notice A that the stop position data to be used by the transportation vehicle 200 is set to the first stop position data D100.

After transmitting the setting completion notice A, the control unit 110 of the ground controller 100 performs a process for changing transportation destination A (S116A).

In the process for changing transportation destination A, the control unit 110 changes, from the manufacturing apparatus 410 to the buffer apparatus 420, the apparatus to be the destination of transportation according to the received transport-to-manufacturing-apparatus instruction upon receiving the transport-to-manufacturing-apparatus instruction from the MES 50. In other words, the process for changing transportation destination A is a process for changing the apparatus to be the destination of the transportation of the cassette C11 by the transportation vehicle 200 (transportation destination apparatus) from the manufacturing apparatus 410 to the buffer apparatus 420. In this case, upon receiving, from the MES 50, the transport-to-manufacturing-apparatus instruction, the control unit 110 transmits, to the transportation vehicle 200, the received transport-to-buffer-apparatus instruction.

Here, it is assumed that the MES 50 transmits, to the ground controller 100, a transport-to-manufacturing-apparatus instruction (S52).

Then, the control unit 110 of the ground controller 100 receives the transport-to-manufacturing-apparatus instruction. In this case, the apparatus to be the destination of transportation of the cassette C11 by the transportation vehicle 200 is the buffer apparatus 420, and therefore the control unit 110 transmits, to the transportation vehicle 200, the received transport-to-buffer-apparatus instruction (S117A).

The transport-to-buffer-apparatus instruction includes load port information. The load port information indicates, for example, the load port to be the destination onto which the cassette C11 is loaded. The load port information also indicates operational information. The operational information indicates, for example, an operation for moving the cassette C11 onto the load port indicated as the destination by the load port information.

Upon receiving the transport-to-buffer-apparatus instruction, the control unit 210 of the transportation vehicle 200 performs a stop process A (S215A). In the stop process A, the control unit 210 performs control such that the transportation vehicle 200 stops at, among the four stop positions indicated by the first stop position data D100, a stop position corresponding to the load port indicated by the load port information in the transport-to-buffer-apparatus instruction (for example, the load port PT11) so that the cassette C11 is transported to the buffer apparatus 420.

This causes the transportation vehicle 200 to travel to the stop position corresponding to the load port indicated by the load port information and stop there to perform the operation indicated by the operational information indicated by the load port information.

As described above, when the apparatus to be the destination of transportation of the cassette C11 by the transportation vehicle 200 is changed, setting is changed so that the transportation vehicle 200 uses stop position data corresponding to the apparatus to be the destination of transportation of the cassette C11 by the transportation vehicle 200 after the change. Only such change of setting allows the transportation vehicle 200 to stop at the stop position corresponding to the apparatus after the change.

As a result, an advantageous effect is achieved that stop positions of the transportation vehicle can be quickly changed.

This allows quick restart of transportation after maintenance of the buffer apparatus 420 when an operator removes the buffer apparatus 420 from the manufacturing apparatus 410 for the maintenance.

In addition, an operator is no longer required to adjust stop position data indicating the stop positions of the transportation vehicle because the first stop position data D100 and the second stop position data D200 are stored in the transportation vehicle 200, so that a period of route down after removing the buffer apparatus 420 from the manufacturing apparatus 410 or mounting the buffer apparatus 420 on the manufacturing apparatus 410 can be short. That is, a time necessary for line restart can be made very short.

In addition, as an operator is no longer required to adjust stop position data indicating the stop positions of the transportation vehicle, items of physical work by an operator are reduced so that human errors can be reduced.

According to the embodiment of the present invention, the first stop position data D100 and the second stop position data D200 are stored in the memory unit 220 of the transportation vehicle 200 in advance. However, the present invention is not limited to this, and the first stop position data D100 and the second stop position data D200 may be stored in the ground controller 100. Then, the ground controller 100 may transmit the first stop position data D100 or the second stop position data D200 to the transportation vehicle 200 as necessary.

(Functional Block Diagram)

Figure 13:
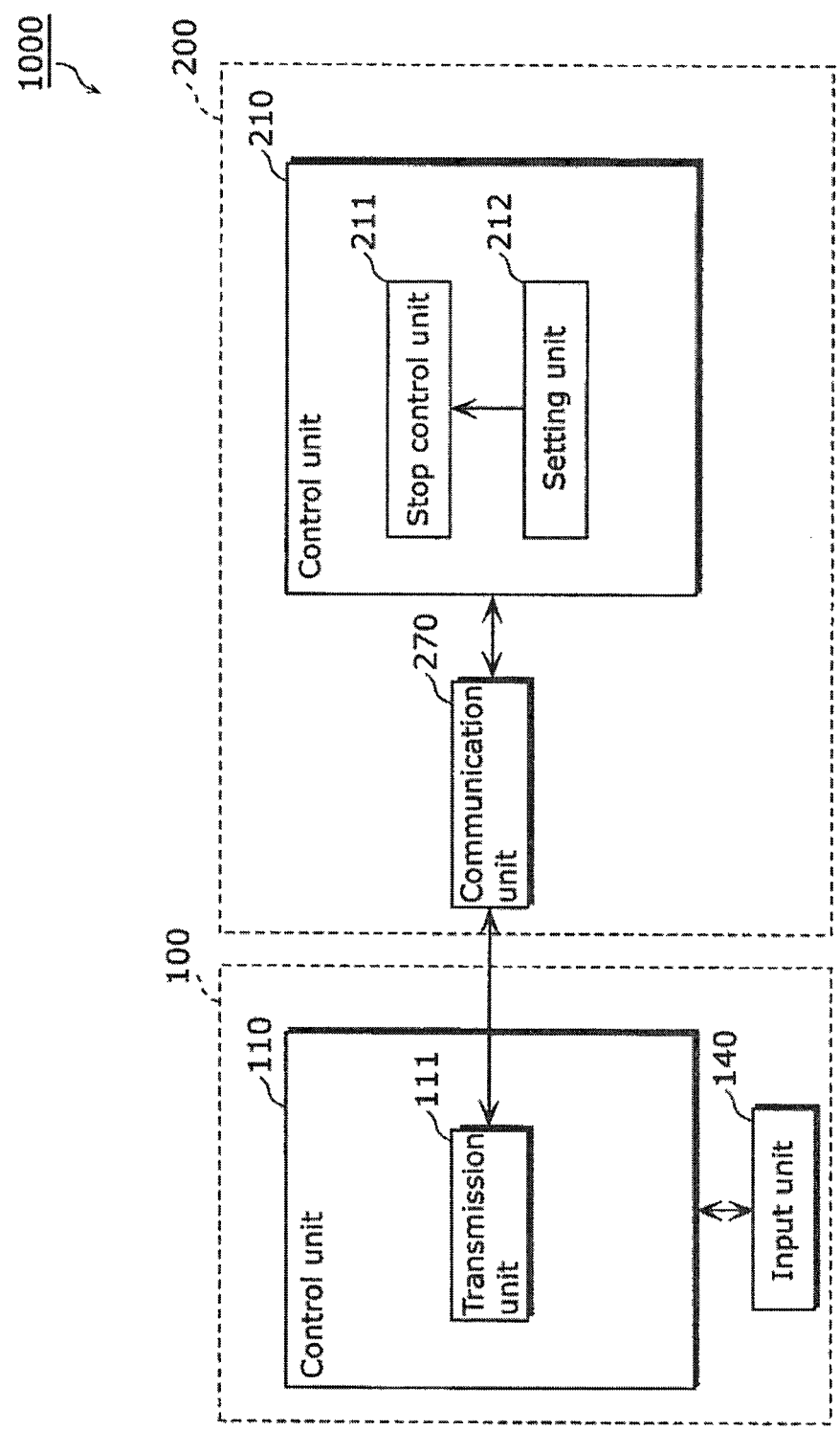
FIG. 13 is a block diagram illustrating a characteristic functional configuration of the transportation system according to the present invention.

FIG. 13 is a block diagram illustrating a characteristic functional configuration of the transportation system 1000 according to the present invention. Specifically, FIG. 13 is a block diagram illustrating functions related to the present invention among the functions of the ground controller 100 provided in the hardware configuration as shown in FIG. 6 and the functions of the transportation vehicle 200 provided in the hardware configuration as shown in FIG. 7.

FIG. 13 shows the control unit 110, the input unit 140, the control unit 210, and the communication unit 270 for illustrative purposes.

The control unit 110 of the ground controller 100 functionally includes a transmission unit 111.

The control unit 210 of the transportation vehicle 200 functionally includes a stop control unit 211.

The transmission unit 111 transmits first data or second data to the transportation vehicle 200. The first data is data for causing the transportation vehicle 200 to stop at the first stop position at which the transportation vehicle 200 can load an article onto the buffer apparatus 420. The second data is data for causing the transportation vehicle 200 to stop at the second stop position corresponding to the first apparatus.

The communication unit 270 of the transportation vehicle 200 receives the first data or the second data.

When receiving the first data, the stop control unit 211 performs control such that the transportation vehicle 200 stops at the first stop position. When receiving the second data, the stop control unit 211 performs control such that the transportation vehicle 200 stops at the second stop position.

When the input unit 140 receives an operation for causing the transportation vehicle 200 to use the first stop position data, the transmission unit 111 transmits, to the transportation vehicle 200, the first setting change data for causing the transportation vehicle 200 to use the first stop position data. When the input unit 140 receives an operation for causing the transportation vehicle 200 to use the second stop position data, the transmission unit 111 transmits, to the transportation vehicle 200, the second setting change data for causing the transportation vehicle 200 to use the second stop position data.

In addition, the control unit 210 of the transportation vehicle 200 functionally includes a setting unit 212.

When the communication unit 270 receives the first setting change data, the setting unit 212 makes a setting such that the stop control unit 211 uses the first stop position data. When the communication unit 270 receives the second setting change data, the setting unit 212 makes a setting such that the stop control unit 211 uses the second stop position data.

The transmission unit 111 included in the control unit 110 may be constructed in hardware. Alternatively, the transmission unit 111 may be a program module to be executed by the control unit 110.

All or part of the stop control unit 211 and the setting unit 212 included in the control unit 210 may be constructed in hardware. Alternatively, all or part of the stop control unit 211 and the setting unit 212 may be implemented as a program module to be executed by the control unit 210.

The embodiment disclosed herein are exemplary in all respects and should never be considered limiting. The scope of the present invention is indicated not by the description above but by the claims, and is intended to include any modification within the scope and the sense of equivalents of the claims.

INDUSTRIAL APPLICABILITY

The present invention is applicable to a transportation system in which stop positions of a transportation vehicle can be quickly switched.

REFERENCE SIGNS LIST

L10 Track
50 MES
100 Ground controller
110, 210 Control unit
120, 220 Memory unit
140 Input unit
170, 270 Communication unit
200 Transportation vehicle
410 Manufacturing apparatus
420 Buffer apparatus
1000 Transportation system

The invention claimed is:

1. A transportation system including: a track which is predetermined; a transportation vehicle capable of transporting an article to a first apparatus by traveling along said track; and a controller which controls said transportation vehicle,
said transportation system further comprising
a second apparatus which is detachable from said first apparatus and onto which said transportation vehicle loads the article,
wherein said controller includes
a transmission unit configured to transmit, to said transportation vehicle, first data when said second apparatus is mounted on said first apparatus, and second data when said second apparatus is detached from said first apparatus, the first data being data for causing said transportation vehicle to stop at a first stop position at which said transportation vehicle can load the article onto said second apparatus, and the second data being data for causing said transportation vehicle to stop at a second stop position corresponding to said first apparatus, and
said transportation vehicle includes:
a communication unit configured to receive the first data or the second data; and
a stop control unit configured to perform control so as to stop said transportation vehicle at the first stop position when said stop control unit receives the first data, and perform control so as to stop said transportation vehicle at the second stop position when said stop control unit receives the second data.

2. The transportation system according to claim 1,
wherein said transportation vehicle further includes
a memory unit configured to store first stop position data indicating the first stop position and second stop position data indicating the second stop position,
said controller further includes
an input unit configured to receive an operation by an operator,
said transmission unit of said controller is configured to transmit first setting change data to said transportation vehicle when said input unit receives an operation for causing said transportation vehicle to use the first stop position data, and transmit second setting change data to said transportation vehicle when said input unit receives an operation for causing said transportation vehicle to use the second stop position data, the first setting change data being data for causing said transportation vehicle to use the first stop position data, and the second setting change data being data for causing said transportation vehicle to use the second stop position data,
said transportation vehicle further includes
a setting unit configured to make a setting such that said stop control unit uses the first stop position data, when said communication unit receives the first setting change data, and make a setting such that said stop control unit uses the second stop position data, when said communication unit receives the second setting change data, said transmission unit of said controller is configured to transmit the first data to said transportation vehicle when said transmission unit transmits the first setting change data, and transmit the second data to said transportation vehicle when said transmission unit transmits the second setting change data, the first data being an instruction for causing said transportation vehicle to stop at the first stop position, and the second data being an instruction for causing said transportation vehicle to stop at the second stop position, and said stop control unit of said transportation vehicle is configured to perform control so as to stop said transportation vehicle at the first stop position indicated by the first stop position data, when said stop control unit receives the first data, and perform control so as to stop said transportation vehicle at the second stop position indicated by the second stop position data, when said stop control unit receives the second data.

3. The transportation system according to claim 1, wherein the first data indicates the first stop position which is between a first point and a second point and is at a first distance from the first point, the first point and the second point being consecutive points on said track, the second data indicates the second stop position which is at a second distance from the first point, the second distance being different from the first distance, and said transmission unit is configured to transmit the first data or the second data to said transportation vehicle.

4. The transportation system according to claim 1, wherein said second apparatus is an apparatus for storing an article unloaded from said first apparatus or an article to be provided to said first apparatus, the first data indicates first stop positions including the first stop position, the second data indicates second stop positions including the second stop position, and the number of the first stop positions indicated by the first data is different from the number of the second stop positions indicated by the second data.

* * * * *